(12) United States Patent
Raghavan et al.

(10) Patent No.: US 12,727,157 B2
(45) Date of Patent: Sep. 1, 2026

(54) MEMORY CELL INCLUDING DUAL-ANTIFUSE DEVICE, MEMORY STRUCTURE, AND OPERATING METHOD

(71) Applicant: GlobalFoundries U.S. Inc., Malta, NY (US)

(72) Inventors: Ramesh Raghavan, Bangalore (IN); Bipul C. Paul, Mechanicville, NY (US); Thirunavukkarasu Ranganathan, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 73 days.

(21) Appl. No.: 18/800,230

(22) Filed: Aug. 12, 2024

(65) Prior Publication Data

US 2026/0047085 A1 Feb. 12, 2026

(51) Int. Cl.
*G11C 17/00* (2006.01)
*G11C 17/16* (2006.01)
(Continued)

(52) U.S. Cl.
CPC ............. *H10B 20/25* (2023.02); *G11C 17/16* (2013.01); *G11C 17/18* (2013.01)

(58) Field of Classification Search
CPC .......... H10B 20/25; G11C 17/16; G11C 17/18
(Continued)

(56) References Cited

U.S. PATENT DOCUMENTS 6,570,798 B1 * 5/2003 McCollum ............. G11C 17/16 365/96
6,879,021 B1 * 4/2005 Fitfield ............... H01L 23/5252 257/532
(Continued)

FOREIGN PATENT DOCUMENTS

CN 110459257 A 11/2019
CN 112447732 A * 3/2021 ............. H10B 99/00
(Continued)

OTHER PUBLICATIONS

U.S. Appl. No. 18/910,268, filed Oct. 9, 2024, 48 pages.
(Continued)

*Primary Examiner* — Viet Q Nguyen
(74) *Attorney, Agent, or Firm* — Ramakrishnan Parthasarathy; Hoffman Warnick LLC

(57) ABSTRACT

Disclosed is a memory cell including a dual-antifuse device between a first pass-gate transistor and a second pass-gate transistor. The dual-antifuse device includes first and second antifuses having a common terminal and each also having an additional terminal opposite the common terminal. The first pass-gate transistor is connected between a first bitline and the additional terminal of the first pass-gate transistor. The second pass-gate transistor is connected between a second bitline and the additional terminal of the second pass-gate transistor. The common terminal of the first and second antifuses and gates of the first and second pass-gate transistors are connected to a wordline. Also disclosed is a memory structure including an array of such memory cells
(Continued)

and an associated operating method. Within the array, different wordline and bitline bias conditions can be employed in order to reliably perform programming or read operations of a selected antifuse in a selected cell.

20 Claims, 4 Drawing Sheets

(51) Int. Cl.
*G11C 17/18* (2006.01)
*H10B 20/25* (2023.01)

(58) Field of Classification Search
USPC .......................................................... 365/96
See application file for complete search history.

(56) References Cited

U.S. PATENT DOCUMENTS 6,897,543 B1 * 5/2005 Huang .................. G11C 17/16 257/E21.666
7,034,353 B2 * 4/2006 Thakur ................. G11C 11/404 257/306
7,553,704 B2 * 6/2009 Min .................... H01L 23/5252 438/770
7,842,969 B2 * 11/2010 Marreiro .................. H10D 8/25 257/E27.018
8,254,198 B2 * 8/2012 Borot ..................... G11C 17/16 365/96
8,313,987 B2 11/2012 Kurjanowicz et al.
8,508,971 B2 * 8/2013 Chiu ...................... G11C 16/10 365/96
8,767,433 B2 * 7/2014 Kurjanowicz ......... G11C 17/16 365/96
8,878,309 B1 11/2014 Hong et al.
8,963,114 B2 2/2015 Liao et al.
9,013,910 B2 * 4/2015 Chen ...................... G11C 17/16 257/317
9,087,588 B2 * 7/2015 Kwon .................... G11C 17/18
9,536,883 B2 * 1/2017 Hui ........................ H10B 20/25
9,852,982 B1 12/2017 Pei et al.
9,935,113 B2 4/2018 Wu et al.
10,109,791 B2 * 10/2018 Kwon .................. H10N 70/801
10,170,625 B2 * 1/2019 Toh .................... H10D 30/6215
10,559,611 B2 * 2/2020 Roy ...................... H10F 39/151
10,770,159 B2 * 9/2020 Huang ................... G11C 17/16
11,342,341 B2 * 5/2022 Chang .................... H10B 20/20
11,502,090 B2 * 11/2022 Huang ................... H10D 89/10
11,735,266 B2 8/2023 Chen et al.
11,758,714 B2 * 9/2023 Liaw .................. H01L 23/5252 257/379
12,154,636 B2 * 11/2024 Hou ....................... G11C 17/16
12,156,400 B2 * 11/2024 Choi ...................... H10B 20/25
2004/0238919 A1 12/2004 Brintzinger et al.
2007/0257331 A1 11/2007 Kurjanowicz et al.
2011/0312175 A1 12/2011 Min et al.
2013/0249017 A1 9/2013 Kwon
2016/0078962 A1 * 3/2016 Park ....................... G11C 17/16 365/96
2017/0345828 A1 * 11/2017 Wu ........................ G11C 7/062
2018/0053767 A1 * 2/2018 Cheng ................. H01L 23/5252
2020/0051987 A1 2/2020 Wang et al.
2021/0202503 A1 7/2021 Chang et al.
2022/0181481 A1 6/2022 Huang et al.
2023/0225118 A1 7/2023 Ding
2024/0114682 A1 4/2024 Cai et al.

FOREIGN PATENT DOCUMENTS

CN 112768452 A 5/2021
CN 113257315 A * 8/2021 ............. G11C 16/08
CN 119008585 A * 11/2024 ............. G11C 17/18
CN 119170080 A * 12/2024 ............. G11C 16/08
KR 101088954 B1 * 12/2011 ............. H10B 20/25
TW I833374 B * 2/2024

OTHER PUBLICATIONS

Li-Yan et al., "Design of 1kbit antifuse one time programmable memory IP using dual program voltage," J. Cent. South Univ. Technol. (2011) 18:125-132.
European Search Report for corresponding EP Application No. 25158714.3-1211 dated Aug. 1, 2025, 43 pages.
European Search Report for corresponding EP Application No. 25168194.6-1211 dated Nov. 28, 2025, 11 pages.
U.S. Appl. No. 19/333,798, filed Sep. 19, 2025, 50 pages.

* cited by examiner

| Mode | WL | | BL | | | Well |
| --- | --- | --- | --- | --- | --- | --- |
| | For row including selected cell | For rows including only unselected cells | For side of column including selected AF of selected cell | For side of column including unselected AF of selected cell | For both sides of columns including only unselected cells | |
| Program | VPGM (e.g., VPGM>3*VDD) | 0 | 0 | VPGM | VPGM | 0 |
| Read | VDD (e.g., VDD>VT) | 0 | 0 | 2*VDD | 2*VDD | 0 |

FIG. 3

MEMORY CELL INCLUDING DUAL-ANTIFUSE DEVICE, MEMORY STRUCTURE, AND OPERATING METHOD

BACKGROUND

The present disclosure relates to one-time programmable (OTP) memories and, more particularly, to embodiments of a memory cell including a dual-antifuse device, a memory structure including an array of such memory cells, and an associated operating method.

Goals of modern integrated circuit design include, but are not limited to, improving performance, reducing area, and reducing power consumption. Oftentimes design changes with respect to one of these goals can result in an undesirable trade-off with respect to one or more of the other goals. For example, memory structures that include one-time programmable (OTP) memory cells are often employed for applications when data needs to be reliably retained during repeated power on and power off cycles. Conventional OTP memory cells include devices, such as fuses or antifuses. To reduce area consumption, dual-antifuse devices have been developed for storing two bits of data, thereby reducing memory structure area. However, results of reading and/or programming operations within such memory structures may be less reliable due, for example, to potential shorts within the array.

SUMMARY

Disclosed herein are embodiments of a memory cell, a memory structure including an array of such memory cells, and an associated operating method.

More particularly, disclosed embodiments of a memory cell can include a dual-antifuse device. This dual-antifuse device can include a first antifuse and a second antifuse, which have a common terminal connected to a wordline. The dual-antifuse device can further include a first pass-gate transistor having a gate connected to the wordline and a second pass-gate transistor having a gate that is also connected to the wordline. The first pass-gate transistor can further be connected between a first bitline and the first antifuse, whereas the second pass-gate transistor can be connected between the second antifuse and a second bitline.

Disclosed embodiments of a memory structure can include an array of memory cells arranged in rows and columns. The memory structure can further include wordlines for the rows, respectively, and a pair of bitlines (i.e., first and second bitlines) for the columns, respectively. Each memory cell in the array can include a dual-antifuse device. This dual-antifuse device can include a first antifuse and a second antifuse, which have a common terminal connected to a wordline for a row. The dual-antifuse device can further include a first pass-gate transistor having a gate connected to the wordline for the row and a second pass-gate transistor having a gate that is also connected to the wordline for the row. The first pass-gate transistor can further be connected between a first bitline for a column and the first antifuse, whereas the second pass-gate transistor can be connected between the second antifuse and a second bitline for the column.

Disclosed embodiments of a method can include providing a memory structure. The memory structure can include an array of memory cells arranged in rows and columns. The memory structure can further include wordlines for the rows, respectively, and a pair of bitlines (i.e., first and second bitlines) for the columns, respectively. Each memory cell in the array can include a dual-antifuse device. This dual-antifuse device can include a first antifuse and a second antifuse, which have a common terminal connected to a wordline for a row. The dual-antifuse device can further include a first pass-gate transistor having a gate connected to the wordline for the row and a second pass-gate transistor having a gate that is also connected to the wordline for the row. The first pass-gate transistor can further be connected between a first bitline for a column and the first antifuse, whereas the second pass-gate transistor can be connected between the second antifuse and a second bitline for the column. The method can further include selectively and individually performing operations directed to selected antifuses of selected memory cells in the array.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which:

FIG. 3 is a table illustrating example wordline and bitline biasing conditions that can be employed during operation of embodiments disclosed herein.

DETAILED DESCRIPTION

As mentioned above, conventional OTP memory cells include devices, such as fuses or antifuses. To reduce area consumption, dual-antifuse devices have been developed for storing two bits of data and thereby reducing memory structure area. However, results of reading and/or programming operations within such memory structures may be less reliable due, for example, to potential shorts within the array.

In view of the foregoing, disclosed herein are embodiments of a memory cell including a dual-antifuse device connected between a first pass-gate transistor and a second pass-gate transistor. Specifically, the dual-antifuse device can include a first antifuse and a second antifuse. Each antifuse can have two terminals including a common terminal (i.e., a shared terminal) with the other antifuse and an additional terminal opposite the common terminal. The first pass-gate transistor can have source/drain regions electrically connected to a first bitline and to the additional terminal of the first antifuse, respectively. Similarly, the second pass-gate transistor can have source/drain regions connected a second bitline and the additional terminal of the second antifuse, respectively. Additionally, the common terminal of the first and second antifuses and gates of the first and second pass-gate transistors can be electrically connected to a wordline. Also disclosed herein are embodiments memory structure including an array of such memory cells and an associated operating method. Within the array, the memory cells can be arranged in rows and columns and different wordline and bitline bias conditions can be employed in order to perform programming or read operations of any selected antifuse in any selected memory cell. As discussed in greater detail below, given the inclusion of the first and second pass-gate transistors within each memory cell and the disclosed wordline and bitline bias conditions for the programming and read operations, such operations can be achieved without experiencing reliability issues such as IR drops due to shorts.

Figure 1:
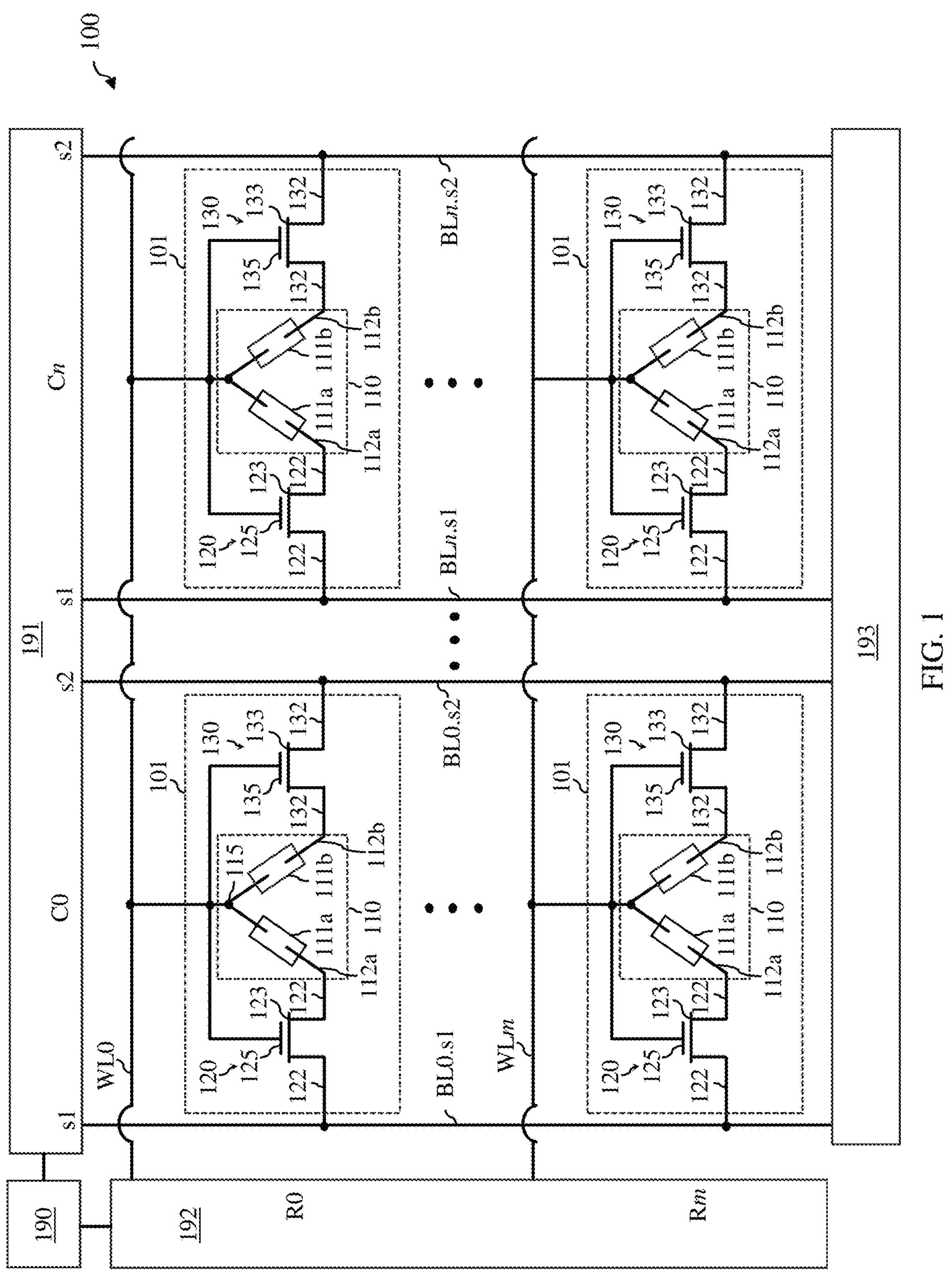
FIG. 1 is a schematic diagram illustrating disclosed embodiments of a memory structure and disclosed embodiments of a memory cell within a memory cell array in the memory structure.

FIG. 1 is a schematic diagram illustrating disclosed embodiments of a dual-antifuse memory cell 101 (also referred to herein as a memory cell or cell) and a memory structure 100 including an array of such cells 101. Within the array, cells 101 can be arranged in columns (e.g., see columns C0-Cn) and rows (e.g., see rows R0 -Rm).

Memory structure 100 can further include wordlines (WL0-WLm) for the rows, respectively. That is, a wordline for a row can be connected to all of the cells within that row. Memory structure 100 can also include first and second bitlines (BL0.*s*1 and BL0.*s*2-BLn.*s*1 and BLn.*s*2) for the columns. That is, the first and second bitlines for a column can both be connected to all cells within that column.

Each cell 101 can include a dual-antifuse device 110. The dual-antifuse device 110 can include a first antifuse 111*a* and a second antifuse 111*b*. For purposes of this disclosure, an antifuse refers to a one-time programmable two-terminal electrical device, which initially has a high resistance state and which is programmable (one-time) into a low resistance state. Thus, an antifuse can effectively be used to store a single bit (e.g., a logic "0" when in the unprogrammed high resistance state and a logic "1" when in the programmed low resistance state or vice versa). Dielectric antifuses employ a thin dielectric layer between two conductors. Generally, with such dielectric antifuses, programming can be achieved by applying a sufficiently high programming voltage (VPGM) to one terminal (i.e., one conductor) and a ground voltage (e.g., 0.0 volts (V)) so that, as a result of current flow therethrough, the dielectric layer between the two conductors breaks down, thereby forming a conductive channel or filament(s) electrically connecting the two conductors.

In the dual-antifuse device 110 included in the cell 101, first and second antifuses 111*a*-111*b* can share a common terminal 115 (also referred to herein as a shared terminal). Additionally, first antifuse 111*a* can have a first additional terminal 112*a* opposite the common terminal 115 and second antifuse 111*b* can have a second additional terminal 112*b* opposite the common terminal 115 and isolated from first additional terminal 112*a*.

Figure 2:
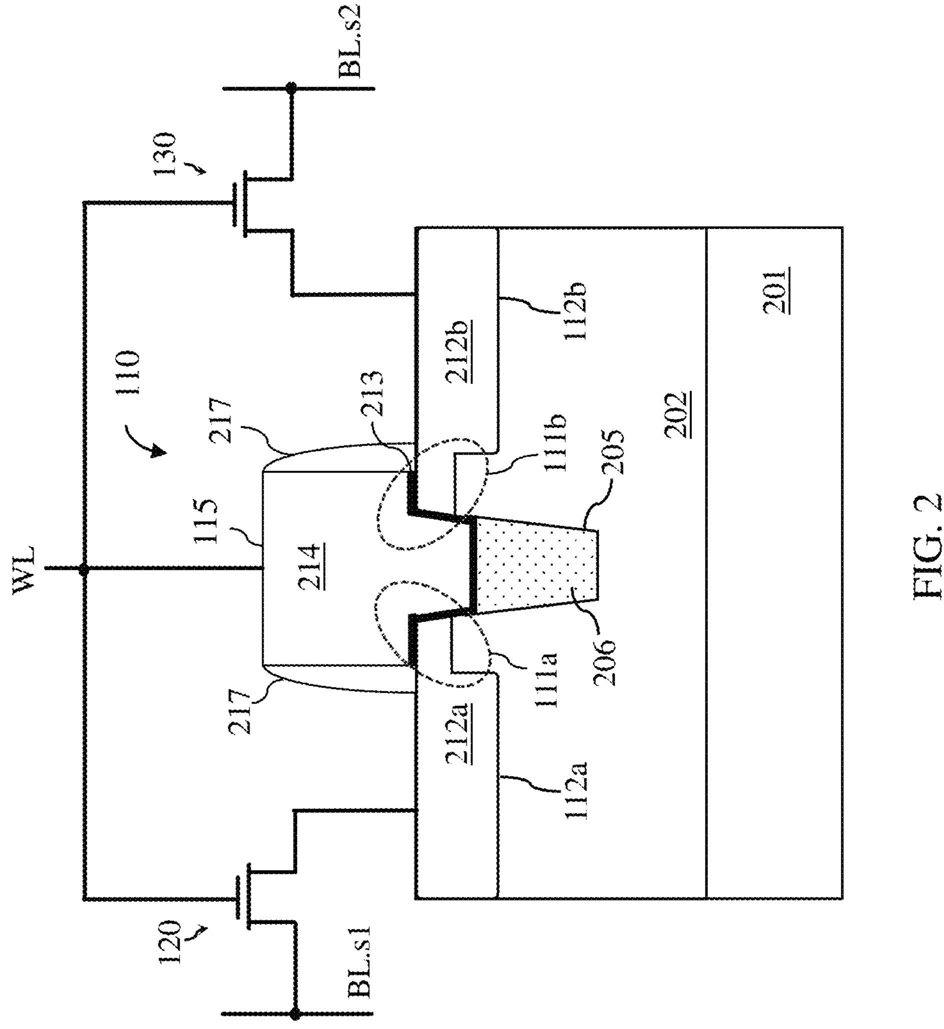
FIG. 2 is drawing illustrating a cross-section of one example of a dual-antifuse device that can be incorporated into memory cells of embodiments disclosed herein.

FIG. 2 is a diagram illustrating a cross-section of one example of a dual-antifuse device 110 that can be incorporated into cell 101. This dual-antifuse device 110 can be formed on a semiconductor layer 201. Semiconductor layer 201 can be, for example, a monocrystalline silicon substrate or, alternatively, a monocrystalline substrate of any other suitable semiconductor material (e.g., silicon germanium, etc.). That is, dual-antifuse device 110 could be a bulk semiconductor structure, as illustrated. Alternatively, semiconductor layer 201 could be a semiconductor layer of a semiconductor-on-insulator structure.

Semiconductor layer 201 can include a first surface (a bottom surface) and a second surface (a top surface) opposite the bottom surface. Dual-antifuse device 110 can further include a first conductive region 212*a* and a second conductive region 212*b* within semiconductor layer 201 adjacent to the second surface and a trench 205, which extends into semiconductor layer 201 from the second surface and which is positioned laterally between and immediately adjacent to first and second conductive regions 212*a*-212*b*. As illustrated, the depth of the trench 205 can be greater depth than the depth of first and second conductive regions 212*a*-212*b*. Trench 205 can have a lower portion and an upper portion above the lower portion. The lower portion can be filled with one or more layers of isolation material 206 (e.g., silicon dioxide, silicon nitride, silicon oxynitride, etc.). A gate stack can be above and immediately adjacent to isolation material 206. For example, a dielectric layer 213 (e.g., a relatively thin silicon dioxide layer, a high-k dielectric layer (i.e., a layer of material having a dielectric constant (k) that is greater than the k of silicon dioxide (i.e., k>3.9), or any other suitable layer(s) of dielectric material) can conformally line the upper portion of trench 205 and can further extend laterally onto the second surface of semiconductor layer 201 only partially over first and second conductive regions 212*a*-212*b*. A conductive polycrystalline semiconductor layer 214 (e.g., a doped polysilicon layer or doped layer of some other suitable polycrystalline semiconductor material) can be on the dielectric layer 213. Thus, the gate stack can include a narrow section within the upper portion of trench 205 and a wide section above the narrow section. Gate sidewall spacer 217 can be above the second surface of semiconductor layer 201 positioned laterally adjacent to sidewalls of the wide section of the gate stack. The first and conductive regions 212*a*-212*b* and the conductive polycrystalline semiconductor layer 214 can, for example, be doped so as to have N-type conductivity at a relatively high conductivity level.

As illustrated, first and second conductive regions 212*a*-212*b* and trench 205 therebetween can be within a well region 202. For purposes of this disclosure, a well region refers to a region of semiconductor material doped (e.g., via a dopant implantation process or any other suitable doping process) so as to have a particular conductivity type. If first and second conductive regions 212*a*-212*b* are N-type conductive regions, then well region 202 can be a P-type well region (Pwell) so the first and second conductive regions 212*a*-212*b* are electrically isolated from each other.

Within this dual-antifuse device 110, first antifuse 111*a* includes first conductive region 212*a*, conductive polycrystalline semiconductor layer 214, and a first portion of dielectric layer 213 between first conductive region 212*a* and conductive polycrystalline semiconductor layer 214. Similarly, second antifuse 111*b* includes second conductive region 212*b*, conductive polycrystalline semiconductor layer 214, and a second portion of dielectric layer 213 between second conductive region 212*b* and conductive polycrystalline semiconductor layer 214. Thus, conductive polycrystalline semiconductor layer 214 is the common terminal 115 between first and second antifuses 111*a*-111*b*, first conductive region 212*a* is the additional terminal 112*a* of first antifuse 111*a*, and second conductive region 212*b* is the additional terminal 112*b* of second antifuse 111*b*.

Dual-antifuse devices similar to the dual-antifuse device described above and illustrated in FIG. 2 are known in the art. Thus, additional details thereof as well as the process techniques for forming such a device have been omitted from this specification in order to allow the reader to focus on the salient aspects of the disclosure related to the overall memory cell configuration, memory array configuration, and operating method. It should be noted that the dual-antifuse device 110 described above and illustrated in FIG. 2 is provided for illustration purposes and is not intended to be limiting. Alternatively, any other suitable type of dual-antifuse device where first and second antifuses 111*a*-111*b* share a common terminal could be employed in cell 101.

Referring again to FIG. 1, each cell 101 can further include a first pass-gate transistor 120 and a second pass-gate transistor 130. First pass-gate transistor 120 can include a first channel region 123 between first source/drain regions and a first gate 125 adjacent to first channel region 123. Second pass-gate transistor 130 can include a second channel region 133 between second source/drain regions 132 and a second gate 135 adjacent to second channel region 133. First and second pass-gate transistors 120 and 130 can be N-type field effect transistors (NFETs). That is, first and second channel regions 123, 133 can be either intrinsic channel regions (i.e., undoped channel regions) or a P-type channel regions with a relatively low conductivity level (i.e., P-channel regions). First and second source/drain region 122, 132 can be an N-type source/drain region with a relatively high conductivity level (i.e., an N+ source/drain region).

Within each cell 101, the common terminal 115 of the first and second antifuses 111*a*-111*b* of the dual-antifuse device 110 and the first and second gates 125 and 135 of the first and second pass-gate transistors 120 and 130 can be electrically connected to a wordline (WL) for a row (R) containing the give cell. Additionally, the first source/drain regions 122 of the first pass-gate transistor 120 can be electrically connected to a first bitline (BL.s1) for a column (C) containing the given cell and to the additional terminal 112*a* of the first antifuse 111*a*, respectively. Similarly, the second source/drain regions 132 of the second pass-gate transistor 130 can be electrically connected to a second bitline (BL.s2) for the column (C) containing the give cell and to the additional terminal 112*b* of the second antifuse 111*b*, respectively.

In some embodiments, the dual-antifuse device 110 can be configured as illustrated in FIG. 2 and can further be positioned laterally between and immediately adjacent to the first pass-gate transistor 120 and the second pass-gate transistor 130 on the same semiconductor layer 201. Although not specifically illustrated, it should be understood that in these embodiments, the first conductive region 212*a* and a first source/drain region 122 of the first pass-gate transistor 120 could be a common/shared N+ region in the semiconductor layer. Similarly, the second conductive region 212*b* and a second source/drain region 132 of the second pass-gate transistor 130 could be a common/shared N+ region in the semiconductor layer. Alternatively, any other suitable electrical connections between the first source/drain region 122 and the first antifuse 111*a* and between the second source/drain region 132 and the second antifuse 111*b* could be employed.

Referring again to FIG. 1, first antifuse 111*a* and second antifuse 111*b* in the dual-antifuse device 110 of any given cell 101 in an array of such cells in memory structure 100 can be selectively and individually programmed (e.g., one-time) as well as selectively and individually read (e.g., multiple times).

More particularly, memory structure 100 can further include: a controller 190; and peripheral circuitry 191-193, which is in communication with controller 190, is connected to the wordlines and bitlines of the array, and which is configured to facilitate memory cell operations (e.g., one-time programming operations and repeated reading operations) in response to control signals from the controller 190. The peripheral circuitry can include a row control block 192, which is electrically connected to the wordlines (WL0-WLm) for the rows (R0-Rm). Row control block 192 can be a conventional row control block, which includes row address decode logic, voltage drivers, etc., for biasing the wordlines, as described below. The peripheral circuitry can also include a column control block 191, which is electrically connected to first bitlines (BL0.*s*1-BLn.s2) and second bitlines (BL0.*s*2-BLn.s2) for the columns (C0-Cm). Column control block 191 can include column and side address decode logic, voltage drivers, etc. for biasing the first and second bitlines, as described below. The peripheral circuitry can further include a sense circuit 193, which is electrically connected to first bitlines (BL0.*s*1-BLn.s1) and second bitlines (BL0.*s*2-BLn.s2). Sense circuit 193 can be configured to sense electrical parameter changes (e.g., voltage changes or current changes) on bitlines during reading operations. Memory controllers, row control blocks, column control blocks, and sense circuits are well known in the art. Thus, the details thereof have been omitted from this specification in order to allow the reader to focus on the salient aspects of the disclosed embodiments related to the overall memory cell configuration, memory array configuration, and operating method.

Figures 4, 5:
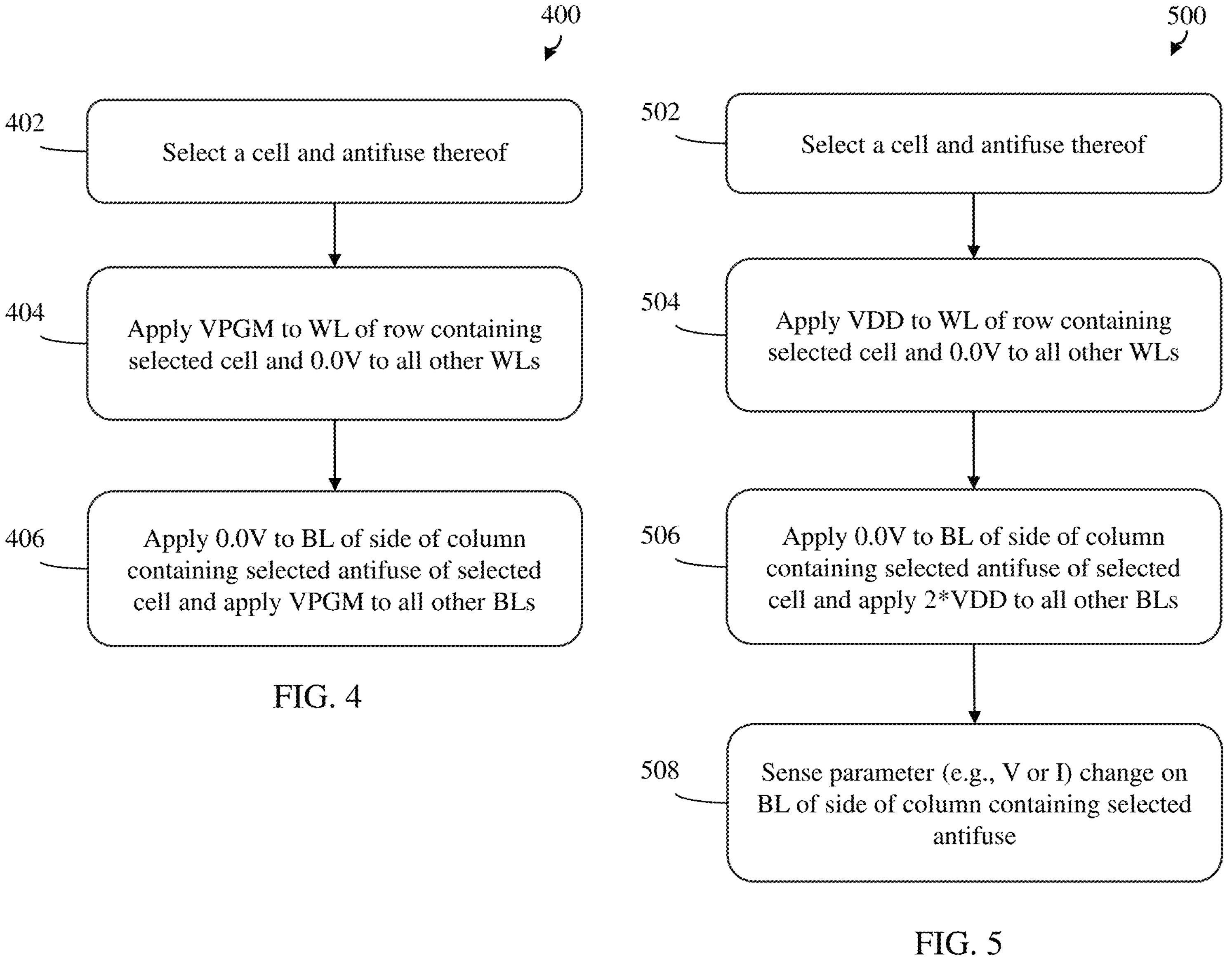
FIGS. 4 and 5 are flow diagrams illustrating methods of operating embodiments disclosed herein.

FIG. 3 is a table illustrating example wordline bias conditions and bitline bias conditions that can be applied by the row control block 192 and the column control block 191, respectively, during both a programming operation directed to a selected antifuse (111*a* or 111*b*) within the dual-antifuse device 110 of a selected cell 101 and also during reading operation directed to a selected antifuse (111*a* or 111*b*) within the dual-antifuse device 110 of a selected cell 101. FIGS. 4 and 5 are flow diagrams illustrating methods of operating the disclosed memory structure 100 and, particularly, a method of performing a one-time programming operation and a method of performing a reading operation, respectively.

Referring to the table of FIG. 3 in conjunction with the flow diagram of FIG. 4. For a programming operation, an antifuse (e.g., 111*a* or 111*b*) within a dual-antifuse device 110 of a cell 101 can be selected (see process 402). That is, the row, column, and side of the column can be selected and address signals can be provided by the controller 190 to the row control block 192 and column control block 191. In response, row control block 192 can apply a programming voltage (VPGM) to a specific wordline that is connected to the selected cell (i.e., to the wordline for the row containing the selected cell) and can further apply 0.0V to all other wordlines (see process 404). Additionally, column control block 191 can apply 0.0V to a specific bitline that is connected (via a pass-gate transistor) to the selected antifuse and can further apply VPGM to all other bitlines (see process 406). Thus, during this programming operation, the common terminal 115 of the first and second antifuses in the selected cell receives VPGM and the gates of the first and second pass-gate transistors in the selected cell receive VPGM. Furthermore, the bitline on the side of the selected cell adjacent to the selected antifuse is at 0.0V and the bitline on the opposite side of the selected cell is at VPGM. Thus, only the pass-gate transistor that is connected to the selected antifuse and the bitline at 0.0V will turn on, allowing current to flow therethrough so the selected antifuse is programmed. All other pass-gate transistors remain off. It should be noted that VPGM can be relatively high and, particularly, at a level sufficient to cause breakdown of the dielectric layer in the selected antifuse.

Referring to the table of FIG. 3 in conjunction with the flow diagram of FIG. 5. For a reading operation, an antifuse (e.g., 111*a* or 111*b*) within a dual-antifuse device 110 of a cell 101 can be selected (see process 502). That is, the row, column, and side of the column can be selected and address signals can be provided by the controller 190 to the row control block 192 and column control block 191. In response, the row control block 192 can apply a first positive supply voltage (VDD) to the specific wordline that is connected to the selected cell (i.e., to the wordline for the row containing the selected cell) and can further apply 0.0V to all other wordlines (see process 504). It should be noted that VDD can be relatively low and, particularly, at or above the level of the threshold voltage (VT) of the first and second pass-gate transistors 120 and 130 but sufficiently low to avoid breakdown of the antifuse dielectric layers. Additionally, the column control block 191 can apply 0.0V to the specific bitline that is connected (via a pass-gate transistor) to the selected antifuse and can further apply a second positive supply voltage (e.g., at 2*VDD) to all other bitlines (see process 506). Thus, during the reading operation, the common terminal of the first and second antifuses receives VDD and the gates of the first and second pass-gate transistors of the selected cell also receive VDD. Furthermore, the bitline on the side of the selected cell adjacent to the selected antifuse is a 0.0V and the bitline on the opposite side of the selected cell is at 2*VDD. Thus, only the pass-gate transistor between the selected antifuse and the bitline at 0.0V turns on. During this reading operation, sense circuit 193 can sense changes in an electrical parameter (e.g., current or voltage) on the bitline connected to the selected antifuse indicative of a stored logic value (see process 508). For example, if the selected antifuse has not been programmed (i.e., if it remains in a high resistance state), current flow to the bitline will be blocked such that the voltage level on the bitline remains low (e.g., indicating a stored logic value of "0"). However, if the selected antifuse has been programmed (i.e., has been switched to a low resistance state), current will flow through the selected antifuse and pass-gate transistor to the bitline and the voltage level on the bitline will be pulled up (e.g., indicating a stored logic value of "1").

It should be noted that, in some embodiments, VPGM could be 3 or more times greater than VDD. For example, in some embodiments, VDD=1.5V, 2*VDD=3.0V, and VPGM≥4.5V.

It should be understood that in the method and structures described above, a semiconductor material refers to a material whose conducting properties can be altered by doping with an impurity. Examples of semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:

a dual-antifuse device including a first antifuse and a second antifuse, wherein the first antifuse and the second antifuse have a common terminal connected to a wordline, wherein the first antifuse has a first additional terminal, and the second antifuse has a second additional terminal electrically isolated from the first additional terminal;

a first pass-gate transistor connected between a first bitline and the first additional terminal; and a second pass-gate transistor connected between the second additional terminal and a second bitline, wherein gates of the first pass-gate transistor and the second pass-gate transistor are connected to the wordline.

2. The structure of claim 1, wherein the dual-antifuse device includes:

a first conductive region and a second conductive region in a semiconductor layer, wherein the semiconductor layer has a first surface and a second surface opposite the first surface, wherein the first conductive region and the second conductive region are adjacent to the second surface, and wherein the first conductive region is electrically isolated from the second conductive region;

a trench extending into the semiconductor layer from the second surface, wherein the trench is positioned laterally between and immediately adjacent to the first conductive region and the second conductive region, wherein the trench has a lower portion filled with isolation material and an upper portion above the lower portion;

a dielectric layer lining the upper portion of the trench above the isolation material and further extending laterally onto the second surface partially over the first conductive region and the second conductive region; and a conductive polycrystalline semiconductor layer on the dielectric layer.

3. The structure of claim 2, wherein the first antifuse includes the first conductive region, the conductive polycrystalline semiconductor layer, and a first portion of the dielectric layer between the first conductive region and the conductive polycrystalline semiconductor layer, wherein the second antifuse includes the second conductive region, the conductive polycrystalline semiconductor layer, and a second portion of the dielectric layer between the second conductive region and the conductive polycrystalline semiconductor layer, and wherein the common terminal includes the conductive polycrystalline semiconductor layer, the first additional terminal includes the first conductive region, and the second additional terminal includes the second conductive region.

4. The structure of claim 2, wherein the first conductive region, the second conductive region, and the conductive polycrystalline semiconductor layer have N-type conductivity.

5. The structure of claim 1, wherein the first pass-gate transistor and the second pass-gate transistor include N-type field effect transistors.

6. The structure of claim 1, wherein the first antifuse and the second antifuse are individually programmable and readable.

7. A structure comprising:

an array of cells arranged in rows and columns;

wordlines for the rows; and first and second bitlines for the columns, wherein each cell includes:

a dual-antifuse device including a first antifuse and a second antifuse, wherein the first antifuse and the second antifuse have a common terminal connected to a wordline for a row, wherein the first antifuse has a first additional terminal, and the second antifuse has a second additional terminal electrically isolated from the first additional terminal;

a first pass-gate transistor connected between a first bitline for a column and the first additional terminal; and a second pass-gate transistor connected between the second additional terminal and a second bitline for the column, wherein gates of the first pass-gate transistor and the second pass-gate transistor are connected to the wordline.

8. The structure of claim 7, wherein the dual-antifuse device includes:

a first conductive region and a second conductive region in a semiconductor layer, wherein the semiconductor layer has a first surface and a second surface opposite the first surface, wherein the first conductive region and the second conductive region are adjacent to the second surface, and wherein the first conductive region is electrically isolated from the second conductive region;

a trench extending into the semiconductor layer from the second surface, wherein the trench is positioned laterally between and immediately adjacent to the first conductive region and the second conductive region, wherein the trench has a lower portion filled with isolation material and an upper portion above the lower portion;

a dielectric layer lining the upper portion of the trench above the isolation material and further extending laterally onto the second surface partially over the first conductive region and the second conductive region; and a conductive polycrystalline semiconductor layer on the dielectric layer.

9. The structure of claim 8, wherein the first antifuse includes the first conductive region, the conductive polycrystalline semiconductor layer, and a first portion of the dielectric layer between the first conductive region and the conductive polycrystalline semiconductor layer, wherein the second antifuse includes the second conductive region, the conductive polycrystalline semiconductor layer, and a second portion of the dielectric layer between the second conductive region and the conductive polycrystalline semiconductor layer, and wherein the common terminal includes the conductive polycrystalline semiconductor layer, the first additional terminal includes the first conductive region, and the second additional terminal includes the second conductive region.

10. The structure of claim 8, wherein the first conductive region, the second conductive region, and the conductive polycrystalline semiconductor layer have N-type conductivity.

11. The structure of claim 7, wherein the first pass-gate transistor and the second pass-gate transistor include N-type field effect transistors.

12. The structure of claim 7, wherein the first antifuse and the second antifuse of each cell in the array are individually programmable and readable.

13. The structure of claim 7, further comprising peripheral circuitry including:

a column control block connected to the first and second bitlines; and a row control block connected to the wordlines; and a controller in communication with the column control block and the row control block.

14. The structure of claim 13, wherein the column control block and the row control block are configured to apply programming bias conditions to the wordlines and the first and second bitlines during programming of a selected antifuse in a selected cell, and wherein the programming bias conditions include:

applying a programming voltage to a specific wordline connected to the selected cell;

applying 0.0V to a specific bitline connected by a specific pass-gate transistor to the selected antifuse of the selected cell;

applying 0.0 volts (V) to all other wordlines; and applying the programming voltage to all other bitlines.

15. The structure of claim 13, wherein the column control block and the row control block are configured to apply reading bias conditions to the wordlines and the first and second bitlines during reading of a selected antifuse in a selected cell in a specific row and a specific column, and wherein the reading bias conditions include:

applying a first positive supply voltage to a specific wordline connected to the selected cell;

applying 0.0V to a specific bitline connected by a specific pass-gate transistor to the selected antifuse of the selected cell;

applying 0.0 volts (V) to all other wordlines; and applying a second positive supply voltage to all other bitlines, wherein the second positive supply voltage is at least twice the first positive supply voltage.

16. A method comprising:

providing a structure, wherein the structure includes an array of cells arranged in rows and columns;

wordlines for the rows; and first and second bitlines for the columns, wherein each cell includes:

a dual-antifuse device including a first antifuse and a second antifuse, wherein the first antifuse and the second antifuse have a common terminal connected to a wordline for a row, wherein the first antifuse has a first additional terminal, and the second antifuse has a second additional terminal electrically isolated from the first additional terminal;

a first pass-gate transistor connected between a first bitline for a column and the first additional terminal; and a second pass-gate transistor connected between the second additional terminal and a second bitline for the column, wherein gates of the first pass-gate transistor and the second pass-gate transistor are connected to the wordline; and selectively and individually performing operations directed to selected antifuses of selected cells in the array.

17. The method of claim 16, wherein the selectively and individually performing of the operations includes performing a programming operation directed to a selected antifuse in a selected cell by:

applying a programming voltage to a specific wordline connected to the selected cell;

applying 0.0V to a specific bitline connected by a specific pass-gate transistor to the selected antifuse of the selected cell;

applying 0.0 volts (V) to all other wordlines; and applying the programming voltage to all other bitlines.

18. The method of claim 16, wherein the selectively and individually performing of the operations includes performing a read operation of a selected antifuse in a selected cell by:

applying a first positive supply voltage to a specific wordline connected to the selected cell;

applying 0.0V to a specific bitline connected by a specific pass-gate transistor to the selected antifuse of the selected cell;

applying 0.0 volts (V) to all other wordlines; and applying a second positive supply voltage to all other bitlines, wherein the second positive supply voltage is at least twice the first positive supply voltage.

19. The method of claim 18, wherein the performing of the read operation further includes sensing a parameter change on the specific bitline.

20. The method of claim 16, wherein the dual-antifuse device includes:

a first conductive region and a second conductive region in a semiconductor layer, wherein the semiconductor layer has a first surface and a second surface opposite the first surface, wherein the first conductive region and the second conductive region are adjacent to the second surface, and wherein the first conductive region is electrically isolated from the second conductive region;

a trench extending into the semiconductor layer from the second surface, wherein the trench is positioned laterally between and immediately adjacent to the first conductive region and the second conductive region, wherein the trench has a lower portion filled with isolation material and an upper portion above the lower portion;

a dielectric layer lining the upper portion of the trench above the isolation material and further extending laterally onto the second surface partially over the first conductive region and the second conductive region; and a conductive polycrystalline semiconductor layer on the dielectric layer, wherein the first antifuse includes the first conductive region, the conductive polycrystalline semiconductor layer, and a first portion of the dielectric layer between the first conductive region and the conductive polycrystalline semiconductor layer, wherein the second antifuse includes the second conductive region, the conductive polycrystalline semiconductor layer, and a second portion of the dielectric layer between the second conductive region and the conductive polycrystalline semiconductor layer, and wherein the common terminal includes the conductive polycrystalline semiconductor layer, the first additional terminal includes the first conductive region, and the second additional terminal includes the second conductive region.

* * * * *